United States Patent
Kim et al.

(10) Patent No.: US 12,422,493 B2
(45) Date of Patent: Sep. 23, 2025

(54) INSULATION RESISTANCE MEASURING DEVICE

(71) Applicant: LG Energy Solution, Ltd., Seoul (KR)

(72) Inventors: Min Woo Kim, Daejeon (KR); Jang Hyeok Choi, Daejeon (KR); Tae Youn Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/269,855

(22) PCT Filed: Nov. 9, 2022

(86) PCT No.: PCT/KR2022/017562
§ 371 (c)(1),
(2) Date: Jun. 27, 2023

(87) PCT Pub. No.: WO2023/085777
PCT Pub. Date: May 19, 2023

(65) Prior Publication Data
US 2024/0319284 A1    Sep. 26, 2024

(30) Foreign Application Priority Data

Nov. 12, 2021   (KR) .................. 10-2021-0155752

(51) Int. Cl.
*G01R 31/389*    (2019.01)
(52) U.S. Cl.
CPC .................. *G01R 31/389* (2019.01)
(58) Field of Classification Search
None
See application file for complete search history.

(56) References Cited

U.S. PATENT DOCUMENTS 11,085,960 B2    8/2021  Chu et al.
2009/0289640 A1*  11/2009  Kawamura .......... G01R 27/025
                                                  324/658
(Continued)

FOREIGN PATENT DOCUMENTS

CN    108872812 A    11/2018
DE    102013215731 A1    2/2015
(Continued)

OTHER PUBLICATIONS

International Search Report for PCT/KR2022/017562 mailed Mar. 2, 2023. 3 pages.
(Continued)

*Primary Examiner* — Jas A Sanghera
(74) *Attorney, Agent, or Firm* — Lerner David LLP

(57) ABSTRACT

Provided is an insulation resistance measuring device for measuring a positive insulation resistor disposed between a positive electrode of a battery pack and a ground and a negative insulation resistor disposed between the ground and a negative electrode of the battery pack, the insulation resistance measuring device including: first and second resistors connected in series between the positive electrode of the battery pack and the ground; third and fourth resistors connected in series between the ground and the negative electrode of the battery pack; an output terminal connected between the third and fourth resistors; and a switch connected between a contact between the first and second resistors and the negative electrode of the battery pack.

8 Claims, 5 Drawing Sheets

(56) References Cited

U.S. PATENT DOCUMENTS

| | | |
|---|---|---|
| 2014/0084933 A1 | 3/2014 | Jang et al. |
| 2014/0095093 A1 | 4/2014 | Hong et al. |
| 2014/0159908 A1 | 6/2014 | Hong et al. |
| 2017/0016951 A1 | 1/2017 | Sung et al. |
| 2018/0074113 A1 | 3/2018 | Sung et al. |
| 2019/0011504 A1 | 1/2019 | Kim et al. |
| 2019/0146040 A1 | 5/2019 | Murakami et al. |
| 2020/0088803 A1 | 3/2020 | Park et al. |
| 2021/0318372 A1 | 10/2021 | Kim |
| 2022/0003823 A1 | 1/2022 | Lee |
| 2022/0146561 A1 | 5/2022 | Ock et al. |
| 2024/0012069 A1 | 1/2024 | Ishii et al. |

FOREIGN PATENT DOCUMENTS

| | | |
|---|---|---|
| EP | 3451003 A2 | 3/2019 |
| JP | H01165973 A | 6/1989 |
| JP | H0980106 A | 3/1997 |
| JP | 2006220520 A | 8/2006 |
| JP | 3962990 B2 | 8/2007 |
| JP | 4280145 B2 | 6/2009 |
| JP | 2012173053 A | 9/2012 |
| JP | 2015509605 A | 3/2015 |
| JP | 2015518141 A | 6/2015 |
| JP | 6665311 B2 | 3/2020 |
| JP | 2022531527 A | 7/2022 |
| KR | 20090024573 A | 3/2009 |
| KR | 101043445 B1 | 6/2011 |
| KR | 20130112802 A | 10/2013 |
| KR | 20130127828 A | 11/2013 |
| KR | 20140041213 A | 4/2014 |
| KR | 101771226 B1 | 9/2017 |
| KR | 101936220 B1 | 1/2019 |
| KR | 20190001330 A | 1/2019 |
| KR | 20200050656 A | 5/2020 |
| KR | 20200058802 A | 5/2020 |
| KR | 20200084517 A | 7/2020 |
| KR | 102155207 B1 | 9/2020 |
| KR | 20210060210 A | 5/2021 |
| KR | 20210126860 A | 10/2021 |
| WO | 2022210668 A1 | 10/2022 |

OTHER PUBLICATIONS

Extended European Search Report including Written Opinion for Application No. 22893197.8 dated May 8, 2024, pp. 1-9.

* cited by examiner

INSULATION RESISTANCE MEASURING DEVICE

CROSS-REFERENCE TO RELATED APPLICATIONS

The present application is a national phase entry under 35 U.S.C. § 371 OF International Application No. PCT/KR2022/017562 filed on Nov. 9, 2022 which claim priority to Korean Patent Application No. 10-2021-0155752 filed on Nov. 12, 2021 in the Republic of Korea, the disclosures of which are incorporated herein by reference.

TECHNICAL FIELD

The present disclosure relates to an insulation resistance measuring device of a battery pack, and more particularly, to an insulation resistance measuring device capable of reducing the number of components.

BACKGROUND ART

As demand for portable electronic products such as laptop computers and mobile phones is significantly increasing, and electric vehicles, energy storage batteries, robots, and satellites are seriously developed, research on a high-performance secondary battery capable of being repeatedly charged and discharged is being actively performed.

The secondary battery that is currently commercialized includes a nickel cadmium battery, a nickel hydrogen battery, a nickel zinc battery, and a lithium secondary battery. Among the commercialized secondary batteries, the lithium secondary battery is widely used due to an extremely low self-discharge rate and a high energy density.

Although the secondary battery is sometimes used as a single secondary battery, in general, a plurality of secondary batteries are connected in series and/or parallel to provide a high-voltage and/or large-capacity power storage device. That is, a battery module in which a plurality of battery cells of the secondary battery are connected or a battery pack in which a plurality of battery modules are connected may be used under a condition requiring high capacity such as an electric vehicle, an energy storage system, and an uninterruptible power supply.

For the power storage device using high-voltage and large-capacity secondary battery, e.g., an electric vehicle including a battery pack, maintaining of an insulation state is extremely important. Here, insulation represents a feature of distinguishing a high-voltage region and a low-voltage region in an electric and electronic device such as an electric vehicle. When an insulation state of the battery pack is not maintained, leakage current may occur to cause various limitations. That is, the leakage current may shorten a lifespan of the battery pack, cause an error of the electric and electronic device using the battery pack, and also cause a safety accident such as electric shock.

In order to prevent the above-described limitations caused by the leakage current, an insulation resistor at a certain level or more is required. Here, the insulation resistor is disposed between the high-voltage region and the low-voltage region. For example, when a high-voltage battery pack is used for an electric vehicle, the insulation resistor is disposed between positive and negative electrodes of a battery pack and a chassis of a vehicle, i.e., the ground, and a resistance value of the insulation resistor needs to be measured and kept from falling below a certain level. The battery pack includes an insulation resistance measuring device to measure the insulation resistance value. The insulation resistance measuring device measures the insulation resistor frequently or periodically to check the insulation state by a battery management system (BMS).

The insulation resistor includes a positive insulation resistor disposed between a positive electrode of a high-voltage battery pack and the ground and a negative insulation resistor disposed between a negative electrode and the ground. A typical insulation resistance measuring device for measuring the above-described insulation resistor includes first and second resistors for voltage distribution, which are connected in parallel with the positive insulation resistor disposed between the positive electrode and the ground, and third and fourth resistors for voltage distribution, which are connected in parallel with the negative insulation resistor disposed between the negative electrode and the ground. Here, a first output signal is output from between the first and second resistors, and a second output signal is output from between the third and fourth resistors. Also, a first switch is disposed between the positive electrode and the first resistor, and a second switch is disposed between the negative electrode and the fourth resistor. Also, a voltage source of 5 V is connected between the ground and the third resistor R3.

However, the above-described typical insulation resistance measuring device requires the two switches and the voltage source of 5V. Also, since the two switches are turned on and off, a switching operation of the switches increases. Thus, a circuit is complicated, and a driving method is complicated. Also, since the first and second output signals are input to first and second input terminals of an analog-digital converter through two voltage distribution resistors, two or more input terminals of the analog-digital converter are required.

The related art is shown in documents below.
Patent document: Korean Patent Registration No. 10-1771226
Non-patent document: Internet Weblog (https://m.blog.naver.com/thewoodypark/222037678937)

SUMMARY

Technical Problem

The present disclosure provides an insulation resistance measuring device capable of reducing the number of switches and simplifying a configuration and a driving method because a voltage source is not required.

The present disclosure also provides an insulation resistance measuring device capable of reducing the number of output terminals to reduce the number of input terminals of an analog-digital converter.

Technical Solution

In accordance with an exemplary embodiment, an insulation resistance measuring device for measuring a positive insulation resistor disposed between a positive electrode of a battery pack and a ground and a negative insulation resistor disposed between the ground and a negative electrode of the battery pack includes: first and second resistors connected in series between the positive electrode of the battery pack and the ground; third and fourth resistors connected in series between the ground and the negative electrode of the battery pack; an output terminal connected between the third and fourth resistors; and a switch connected between a contact between the first and second resistors and the negative electrode of the battery pack.

The first and second resistors may be connected in parallel with the positive insulation resistor, and the third and fourth resistors may be connected in parallel with the negative insulation resistor.

The switch may be configured such that distribution voltage of a first voltage between the positive insulation resistor and the negative insulation resistor may be output from the output terminal when the switch is turned off, a distribution voltage of a second voltage between the positive insulation resistor and the negative insulation resistor may be output from the output terminal when the switch is turned on, and the insulation resistance measuring device is configured to measure insulation resistances of the positive insulation resistor and the negative insulation resistor based on the first and second voltages.

The first voltage may equal:

$$V_{x1} = V_{pack1} \times \frac{\frac{1}{R_{iso+}} + \frac{1}{R_p}}{\frac{1}{R_{iso+}} + \frac{1}{R_p} + \frac{1}{R_{iso-}} + \frac{1}{R_n}}$$

Here, Vx1 is the first voltage, Vpack1 is a voltage of the battery pack when the switch is turned off, Riso+ and Riso– are a resistance value of the positive insulation resistor and a resistance value of the negative insulation resistor, respectively, and $R_{11}+R_{12}=R_p$, $R_{13}+R_{14}=R_n$ wherein Rp is a total resistance of the first and second resistors and Rn is a total resistance of the third and fourth resistors.

The second voltage may equal:

$$V_{x2} = V_{pack2} \times \frac{\frac{1}{R_{iso+}}}{\frac{1}{R_{iso+}} + \frac{1}{R_{iso-}} + \frac{1}{p \times R_p} + \frac{1}{R_n}}$$

Here, Vx2 is the second voltage, Vpack2 is a voltage of the battery pack, and $R_{13}=R_n \times (1-n)$, $R_{14}=R_n \times n$, $R_{13}+R_{14}=R_n$ wherein p is a predetermined resistance ratio for the first and second resistors, n is a predetermined resistance ratio for the third and $R_{11}=R_p \times (1-p)$, $R_{12}=R_p \times p$, $R_{11}+R_{12}=R_p$ fourth resistors.

The resistance value of the positive insulation resistor may equal $$\frac{1}{R_{iso+}} = \frac{V_{x1} \times V_{x2} \times \frac{1}{R_p} \times \left(\frac{1}{p}-1\right) + V_{pack1} \times \frac{1}{R_p} \times V_{x2}}{V_{pack2} \times V_{x1} - V_{pack1} \times V_{x2}}$$

The resistance value of the negative insulation resistor may equal $$\frac{1}{R_{iso-}} = \left(\frac{V_{pack2}}{V_{x2}} - 1\right) \times \frac{1}{R_{iso+}} - \frac{1}{R_n} - \frac{1}{p \times R_p}$$

The insulation resistance measuring device may be further configured to: control the switch; measure an output voltage of the output terminal and calculate the first and second voltages; determine whether the measured output is within a set range; and calculate resistance values of the positive insulation resistor and the negative insulation resistor based on determining whether the measured output voltage is within the set range.

Advantageous Effects

The insulation resistance measuring device in accordance with the exemplary embodiment may reduce the number of switches and may not require the voltage source. Thus, the configuration and driving method of the insulation resistance measuring device may be simplified. Also, one output signal is output, and the output signal is input to the analog-digital converter. Thus, the analog-digital converter requires one input terminal to input the output signal of the insulation resistance measuring device. That is, the number of output terminals may be reduced, and accordingly, the number of input terminals of the analog-digital converter for inputting the output of the insulation resistance measuring device may be reduced in comparison with the related art. As a result, in accordance with the exemplary embodiment, the configuration and driving method of the insulation resistance measuring device may be simplified in comparison with the related art, and the configuration of the peripheral devices that receive signals from the insulation resistance measuring device may be simplified in comparison with the related art.

DETAILED DESCRIPTION

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

Figure 1:
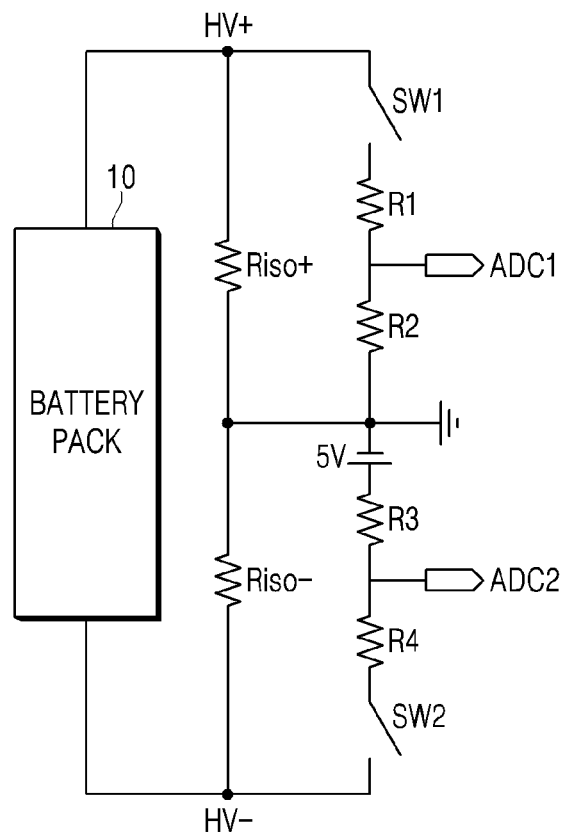
FIG. 1 is a circuit diagram of a typical insulation resistance measuring device.

FIG. 1 is a circuit diagram of a typical insulation resistance measuring device. The typical insulation resistance measuring device measures a positive insulation resistor Riso+ disposed between a positive electrode HV+ of a high voltage battery pack 10 and a ground and a negative insulation resistor Riso– disposed between a negative electrode HV– and the ground.

As illustrated in FIG. 1, the typical insulation resistance measuring device includes first and second resistors R1 and R2 for voltage distribution, which are connected in parallel with the positive insulation resistor Riso+ disposed between the positive electrode HV+ and the ground and third and fourth resistors R3 and R4 for voltage distribution, which are connected in parallel with the negative insulation resistor Riso− disposed between the negative electrode HV− and the ground. Here, a first output signal ADC1 is output from between the first and second resistors R1 and R2, and a second output signal ADC2 is output from between the third and fourth resistors R3 and R4. That is, a distribution voltage between the first and second resistors R1 and R2 is input to a first input terminal of an analog-digital converter, and a distribution voltage between the third and fourth resistors R3 and R4 is input to a second input terminal of the analog-digital converter. Also, a first switch SW1 is disposed between the positive electrode HV+ and the first resistor R1, and a second switch SW2 is disposed between the negative electrode HV− and the fourth resistor R4. Also, a voltage source of 5 V is connected between the ground and the third resistor R3. The voltage source is connected between the third resistor R3 and the ground and applies a voltage so that the voltage applied between the third resistor R3 and the ground has a positive value.

The typical insulation resistance measuring device determines a measurement cycle to repeatedly turn on and off the first and second switches SW1 and SW2. Here, the first and second switches SW1 and SW2 may be simultaneously turned on or off or alternately turned on and off depending on the cycle. As a positive voltage V positive between the positive electrode HV+ and the ground is distributed (ratio: R2/R1+R2) when the first switch SW1 is turned on, the first output signal ADC1 is measured, and on the contrary, as a negative voltage V negative between the negative electrode HV− and the ground is distributed when the second switch SW2 is turned on, the second output signal ADC2 is measured.

However, the above-described typical insulation resistance measuring device requires the two switches and the voltage source of 5V. Also, since the two switches are turned on and off, a switching operation of the switches increases. Thus, a circuit is complicated, and a driving method is complicated. Also, since the first and second output signals are input to the first and second input terminals of the analog-digital converter through two voltage distribution resistors, two or more input terminals of the analog-digital converter are required.

Figure 2:
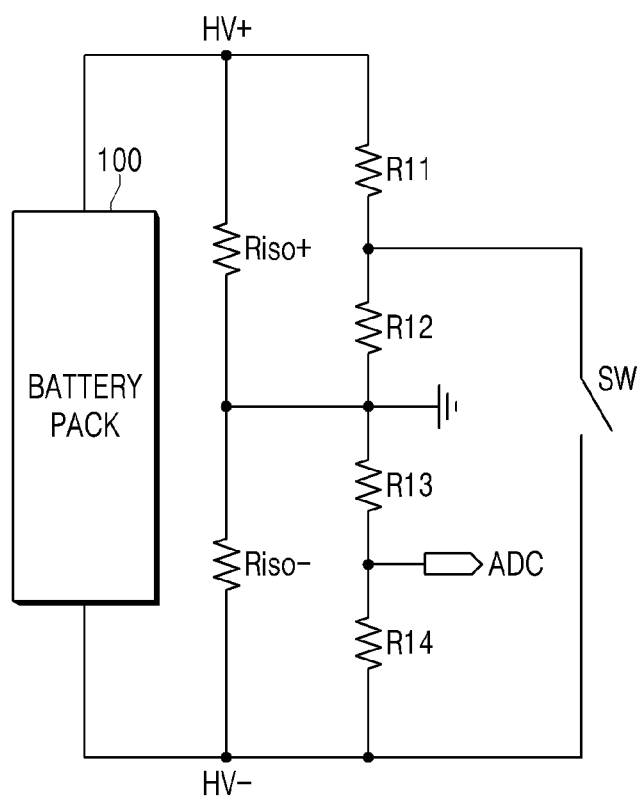
FIG. 2 is a circuit diagram of an insulation resistance measuring device in accordance with an exemplary embodiment.
Figure 3:
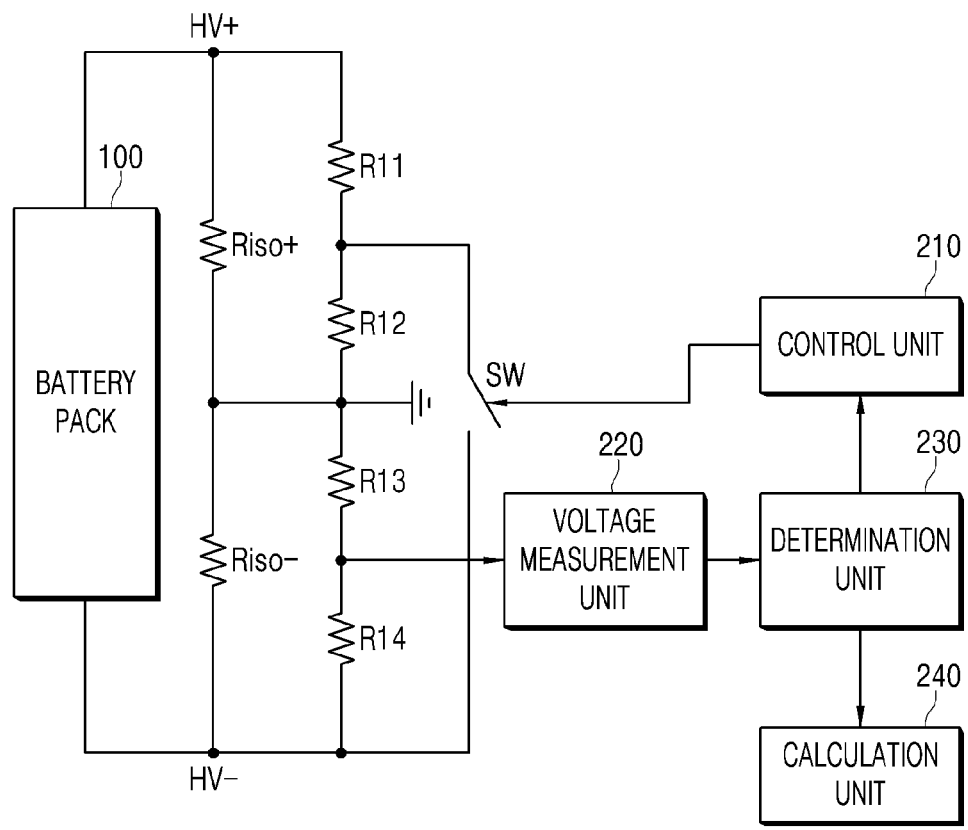
FIG. 3 is a circuit diagram of an insulation resistance measuring device in accordance with another exemplary embodiment.

FIG. 2 is a circuit diagram of an insulation resistance measuring device in accordance with an exemplary embodiment, and FIG. 3 is a block diagram of the insulation resistance measuring device in accordance with an exemplary embodiment. That is, FIG. 3 is a block diagram illustrating the insulation resistance measuring device and peripheral devices thereof in accordance with an exemplary embodiment.

Referring to FIGS. 2 and 3, the insulation resistance measuring device in accordance with an exemplary embodiment may measure the positive insulation resistor Riso+ and the negative insulation resistor Riso− disposed between the positive electrode HV+ and the negative electrode HV− of the battery pack 100. The positive insulation resistor Riso+ is disposed between the ground and the positive electrode HV+ of the battery pack 100, and the negative insulation resistor Riso− is disposed between the ground and the negative electrode HV− of the battery pack 100. The insulation resistance measuring device that measures the insulation resistors Riso+ and Riso− in accordance with an exemplary embodiment may include first and second resistors R11 and R12 for voltage distribution, which are disposed between the positive electrode HV+ and the ground and are connected in parallel with the positive insulation resistor Riso+, third and fourth resistors R13 and R14 for voltage distribution, which are disposed between the negative electrode HV− and the ground and connected in parallel with the negative insulation resistor Riso−, and a switch SW disposed between the negative electrode HV− and the first and second resistors R11 and R12. That is, the insulation resistance measuring device in accordance with an exemplary embodiment reduces the number of switches and does not require a voltage source in comparison with the related art described in FIG. 1.

The first and second resistors R11 and R12 may be disposed between the positive electrode HV+ and the ground and connected in parallel with the positive insulation resistor Riso+. Here, a resistance value of the first resistor R11 and a resistance value of the second resistor R12 may have a set resistance ratio. Here, the set resistance ratio may be a ratio between the resistance value of the first resistor R11 and the resistance value of the second resistor R12, which is set to lower and measure a voltage of the battery pack 100 applied to the first resistor R11.

The third and fourth resistors R13 and R14 may be disposed between the negative electrode HV− and the ground and connected in parallel with the negative insulation resistor Riso−. Here, a resistance value of the third resistor R13 and a resistance value of the fourth resistor R14 may have a set resistance ratio. Here, the set resistance ratio may be a ratio between the resistance value of the third resistor R13 and the resistance value of the fourth resistor R14, which is set to lower and measure the voltage of the battery pack 100 applied to the third resistor R13. Also, an output signal ADC may be output from between the third and fourth resistors R13 and R14. The output signal ADC between the third and fourth resistors R13 and R14, i.e., a distribution voltage between the third and fourth resistors R13 and R14, may be input to the analog-digital converter. That is, the insulation resistance measuring device in accordance with an exemplary embodiment outputs one output signal, and the output signal is input to the analog-digital converter. Thus, the analog-to-digital converter requires one input terminal to input the output signal of the insulation resistance measuring device. That is, the number of output terminals may be reduced, and accordingly, the number of input terminals of the analog-to-digital converter for inputting the output of the insulation resistance measuring device may be reduced in comparison with the related art.

The switch SW is disposed between the first and second resistors R11 and R12 and the negative electrode HV−. That is, the switch SW is disposed between a node between the first and second resistors R11 and R12 and the negative electrode HV−. The switch SW may be turned on and off to adjust a voltage of the output terminal ADC. That is, a distribution voltage of a first voltage Vx1 and a distribution voltage of a second voltage Vx2 are output from between the third and fourth resistors R13 and R14 according to the on and off of the switch SW. The distribution voltage of the first voltage Vx1 and the distribution voltage of the second voltage Vx2 are output according to the on/off of the switch SW, and accordingly, the first voltage Vx1 and the second voltage Vx2 are calculated and resistance values of the positive insulation resistor Riso+ and the negative insulation resistor Riso− may be calculated.

As illustrated in FIG. 3, the insulation resistance measuring device in accordance with an exemplary embodiment may further include a control unit 210 controlling the switch SW, a voltage measurement unit 220 measuring a voltage of the output signal from between the third and fourth resistors R13 and R14, a determination unit 230 determining whether the voltage measured by the voltage measurement unit 220 is within a set range, and a calculation unit 240 calculating the resistance values of the positive insulation resistor Riso+ and the negative insulation resistor Riso− according to a determination result of the determination unit 230.

The control unit 210 may control the switch SW. That is, the control unit 210 may control the switch SW to turn on and off the switch SW. The control unit 210 may periodically control the switch SW and allow on and off cycles to be the same as each other. Alternatively, the control unit 210 may intermittently control the switch SW and allow the on and off cycles to be different from each other. The control unit 210 may control the switch SW according to the determination result of the determination unit 230.

The voltage measurement unit 220 measures a voltage of the output signal from between the third and fourth resistors R13 and R14. That is, a distribution voltage of the first voltage Vx1 and a distribution voltage of the second voltage Vx2 are output from between the third and fourth resistors R13 and R14 according to the on and off of the switch SW, and the voltage measurement unit 220 calculates the first voltage Vx1 and the second voltage Vx2. That is, the voltage measurement unit 220 measures the distribution voltage of the first voltage Vx1 and the distribution voltage of the second voltage Vx2 and calculates the first voltage Vx1 and the second voltage Vx2 based on the measured distribution voltages. Here, the voltage measurement unit 220 calculates the first voltage Vx1 by [Equation 1], which will be described later, and calculates the second voltage Vx2 by [Equation 2], which will be described later. Also, the voltage measurement unit 220 may include an analog-to-digital converter that converts an analog voltage signal into a digital voltage signal. That is, the voltage measurement unit 220 may include the analog-to-digital converter and measure a voltage after analog voltage signals of the distribution voltage of the first voltage Vx1 and the distribution voltage of the second voltage Vx2 output from between the third and fourth resistors R13 and R14 is converted into digital voltage signals.

The determination unit 230 may determine whether the first voltage Vx1 and the second voltage Vx2 calculated by the voltage measurement unit 220 are within a set voltage range. That is, the determination unit 230 may determine whether measured values of the first voltage Vx1 and the second voltage Vx2 are within the set range and transmit a determination result to the control unit 210 and the calculation unit 240. The determination unit 230 may compare the measured value of the first voltage Vx1 with a set range value and determine that the first voltage Vx1 is normal when the measured value of the first voltage Vx1 is within the set range. Similarly, the determination unit 230 may compare the measured value of the second voltage Vx2 with the set range value and determine that the second voltage Vx2 is normal when the measured value of the second voltage Vx2 is within the set range.

The control unit 210 may turn off the switch SW when the first voltage Vx1 is determined as normal based on the determination result of the determination unit 230 and turn on the switch SW when the second voltage Vx2 is determined as normal. Through this, the control unit 210 may reduce a time required to measure an insulation resistor by flexibly changing a cycle of switching an on or off state of the switch SW for insulation resistance measurement according to whether the first voltage Vx1 and the second voltage Vx2 are converged instead of setting the cycle.

The calculation unit 240 may calculates resistance values of the positive insulation resistor Riso+ and the negative insulation resistor Riso− by using the first voltage Vx1 at the time when the first voltage Vx1 is determined as normal from the determination unit 230, the second voltage Vx2 at the time when the second voltage Vx2 is determined as normal from the determination unit 230, and the voltage of the battery pack 100 at the time of calculation. Here, the calculation unit 240 may calculates the first and second voltages by using [Equation 1] and [Equation 2], which will be described later, and the positive insulation resistor Riso+ and the negative insulation resistor Riso− by using [Equation 3] and [Equation 4], which will be described later. The voltage of the battery pack 100 may be received from a battery management system (BMS) that manages the battery pack.

As described above, the insulation resistance measuring device in accordance with an exemplary embodiment may reduce the number of switches and may not require the voltage source in comparison with the related art described in FIG. 1. Also, in accordance with an exemplary embodiment, one output signal is output, and the output signal is input to the analog-digital converter. Thus, the analog-digital converter requires one input terminal to input the output signal of the insulation resistance measuring device. That is, the number of output terminals may be reduced, and accordingly, the number of input terminals of the analog-digital converter for inputting the output of the insulation resistance measuring device may be reduced in comparison with the related art.

Figure 4:
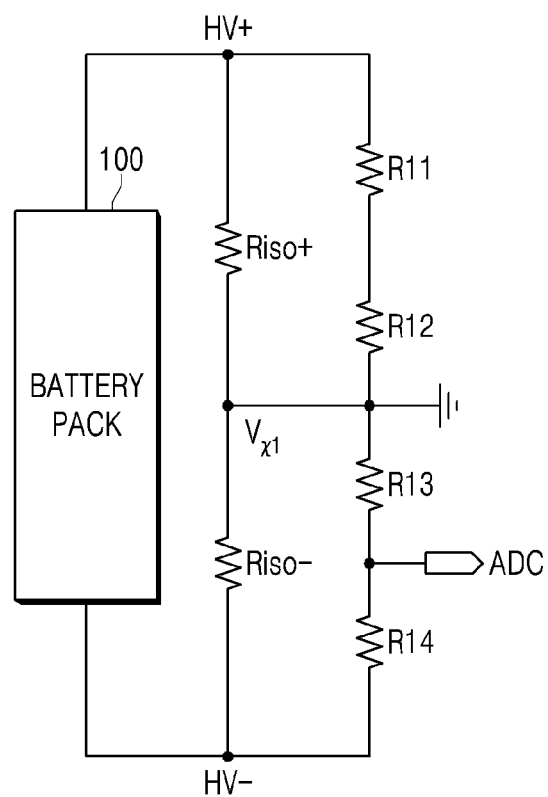
FIGS. 4 and 5 are equivalent circuit diagrams of the insulation resistance measuring device in accordance with an exemplary embodiment.
Figure 5:
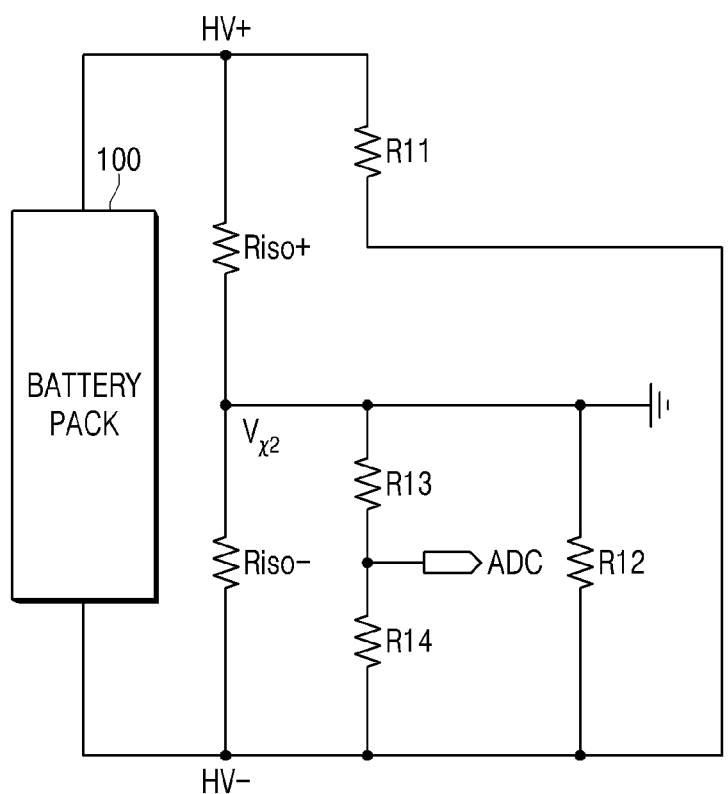

FIGS. 4 and 5 are equivalent circuit diagrams of the insulation resistance measuring device according to the on/off of the switch. FIG. 4 is an equivalent circuit diagram when the switch is turned off, and FIG. 5 is an equivalent circuit diagram when the switch is turned on.

As illustrated in FIG. 4, when the switch is turned off, the first voltage Vx1 output from between the positive insulation resistor Riso+ and the negative insulation resistor Riso− may be obtained by Equation 1 below.

$$V_{x1} = V_{pack1} \times \frac{\frac{1}{R_{iso+}} + \frac{1}{R_p}}{\frac{1}{R_{iso+}} + \frac{1}{R_p} + \frac{1}{R_{iso-}} + \frac{1}{R_n}} \quad \text{[Equation 1]}$$

Here, Vx1 is the first voltage, Vpack1 is the voltage of the battery pack when the switch is turned off, Riso+ and Riso− are the resistance value of the positive insulation resistor and the resistance value of the negative insulation resistor, respectively, and Rp and Rn may be obtained as follows.

$$R_{11} + R_{12} = R_p \quad R_{13} + R_{14} = R_n$$

As illustrated in FIG. 5, when the switch is turned on, the second voltage Vx2 output from between the positive insulation resistor Riso+ and the negative insulation resistor Riso− may be obtained by [Equation 2] below.

$$V_{x2} = V_{pack2} \times \frac{\frac{1}{R_{iso+}}}{\frac{1}{R_{iso+}} + \frac{1}{R_{iso-}} + \frac{1}{p \times R_p} + \frac{1}{R_n}} \quad \text{[Equation 2]}$$

Here, Vx2 is the second voltage, Vpack2 is the voltage of the battery pack when the switch is turned on, Riso+ and Riso− are the resistance value of the positive insulation resistor and the resistance value of the negative insulation resistor, respectively, and Rp and Rn may be obtained as follows.

$$R_{11} = R_p \times (1-p), R_{12} = R_p \times p, R_{11} + R_{12} = R_p$$

$$R_{13} = R_n \times (1-n), R_{14} = R_n \times n, R_{13} + R_{14} = R_n$$

The resistance value of the positive insulation resistor Riso+ may be obtained by [Equation 1] and [Equation 2], and the resistance value of the negative insulation resistor Riso− may be obtained by [Equation 3] and [Equation 4]. That is, [Equation 3] is an equation for calculating the resistance value of the positive insulation resistor Riso+ by combining [Equation 1] and [Equation 2], and [Equation 4] is an equation for calculating the resistance value of the negative insulation resistor Riso− by using [Equation 2].

$$\frac{1}{R_{iso+}} = \frac{V_{x1} \times V_{x2} \times \frac{1}{R_p} \times \left(\frac{1}{p}-1\right) + V_{pack1} \times \frac{1}{R_p} \times V_{x2}}{V_{pack2} \times V_{x1} - V_{pack1} \times V_{x2}} \quad \text{[Equation 3]}$$

$$\frac{1}{R_{iso-}} = \left(\frac{V_{pack2}}{V_{x2}} - 1\right) \times \frac{1}{R_{iso+}} - \frac{1}{R_n} - \frac{1}{p \times R_p} \quad \text{[Equation 4]}$$

As described above, the technical idea of the present invention has been specifically described with respect to the above embodiments, but it should be noted that the foregoing embodiments are provided only for illustration while not limiting the present invention. Also, various embodiments may be provided to allow those skilled in the art to understand the scope of the preset invention, but the present invention is not limited thereto.

The reference numerals used in the drawings in the present invention are as follows.

| | |
|---|---|
| 100: Battery pack | R11, R12, R13, R14: First to fourth resistors |
| SW: Switch | Vx1, Vx2: First and second voltages |
| 210: Control unit | 220: Voltage measurement unit |
| 230: Determination unit | 240: Calculation unit |

What is claimed is:

1. An insulation resistance measuring device for determining a positive insulation resistor disposed between a positive electrode of a battery pack and a ground and a negative insulation resistor disposed between the ground and a negative electrode of the battery pack, comprising:
    first and second resistors connected in series between the positive electrode of the battery pack and the ground;
    third and fourth resistors connected in series between the ground and the negative electrode of the battery pack;
    an output terminal connected between the third and fourth resistors; and
    a switch connected between a contact between the first and second resistors and the negative electrode of the battery pack, wherein the insulation resistance measuring device is configured to measure a first voltage at the output terminal when the switch is closed and a second voltage at the output terminal when the switch is open, and determine each of a positive insulation resistance of the positive insulation resistor and a negative insulation resistance of the negative insulation resistor based on the first voltage and the second voltage.

2. The insulation resistance measuring device of claim 1, wherein the first and second resistors are connected in parallel with the positive insulation resistor, and the third and fourth resistors are connected in parallel with the negative insulation resistor.

3. The insulation resistance measuring device of claim 2, wherein the switch is configured such that a first distribution voltage between the positive insulation resistor and the negative insulation resistor is output from the output terminal when the switch is turned off, a second distribution voltage between the positive insulation resistor and the negative insulation resistor are output from the output terminal when the switch is turned on.

4. The insulation resistance measuring device of claim 3, wherein the first voltage equals:

$$V_{x1} = V_{pack1} \times \frac{\frac{1}{R_{iso+}} + \frac{1}{R_p}}{\frac{1}{R_{iso+}} + \frac{1}{R_p} + \frac{1}{R_{iso-}} + \frac{1}{R_n}}$$

wherein, Vx1 is the first voltage, Vpack1 is a voltage of the battery pack when the switch is turned off, Riso+ and Riso− are a resistance value of the positive insulation resistor and a resistance value of the negative insulation resistor, respectively, and wherein Rp is a total resistance of the first and second resistors and Rn is a total resistance of the third and fourth resistors.

5. The insulation resistance measuring device of claim 4, wherein the second voltage equals:

$$V_{x2} = V_{pack2} \times \frac{\frac{1}{R_{iso+}}}{\frac{1}{R_{iso+}} + \frac{1}{R_{iso-}} + \frac{1}{p \times R_p} + \frac{1}{R_n}}.$$

wherein, Vx2 is the second voltage, Vpack2 is a voltage of the battery pack and wherein p is a predetermined resistance ratio for the first and second resistors, n is a predetermined resistance ratio for the third and fourth resistors.

6. The insulation resistance measuring device of claim 5, wherein the resistance value of the positive insulation resistor equals:

$$\frac{1}{R_{iso+}} = \frac{V_{x1} \times V_{x2} \times \frac{1}{R_p} \times \left(\frac{1}{p}-1\right) + V_{pack1} \times \frac{1}{R_p} \times V_{x2}}{V_{pack2} \times V_{x1} - V_{pack1} \times V_{x2}}.$$

7. The insulation resistance measuring device of claim 6, wherein the resistance value of the negative insulation resistor equals:

$$\frac{1}{R_{iso-}} = \left(\frac{V_{pack2}}{V_{x2}} - 1\right) \times \frac{1}{R_{iso+}} - \frac{1}{R_n} - \frac{1}{p \times R_p}.$$

8. The insulation resistance measuring device of claim 7, wherein the insulation resistance measuring device is further configured to:

control the switch;
measure an output voltage of the output terminal and calculate the first and second voltages;
determine whether the measured output voltage is within a set range; and
calculate resistance values of the positive insulation resistor and the negative insulation resistor based on determining whether the measured output voltage is within the set range.

* * * * *